(12) United States Patent
Yang et al.

(10) Patent No.: US 8,737,113 B2
(45) Date of Patent: May 27, 2014

(54) MEMORY RESISTOR HAVING MULTI-LAYER ELECTRODES

(75) Inventors: Jianhua Yang, Palo Alto, CA (US); Wei Wu, Palo Alto, CA (US); Gilberto Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 312 days.

(21) Appl. No.: 13/387,063

(22) PCT Filed: Feb. 8, 2010

(86) PCT No.: PCT/US2010/023492
§ 371 (c)(1),
(2), (4) Date: Jan. 25, 2012

(87) PCT Pub. No.: WO2011/096940
PCT Pub. Date: Aug. 11, 2011

(65) Prior Publication Data
US 2012/0120714 A1   May 17, 2012

(51) Int. Cl.
*G11C 11/00* (2006.01)
(52) U.S. Cl.
USPC .......................................... 365/148; 365/158

(58) Field of Classification Search
USPC .......................................... 365/148, 158, 163
See application file for complete search history.

(56) References Cited

U.S. PATENT DOCUMENTS

| 8,520,425 B2 * | 8/2013 | Xiao et al. ............... 365/148 |
| 2005/0009286 A1 | 1/2005 | Hsu et al. |
| 2008/0266931 A1 | 10/2008 | Tang et al. |
| 2012/0280198 A1 * | 11/2012 | Smythe et al. ............... 257/2 |

FOREIGN PATENT DOCUMENTS

| KR | 20050050044 A | 5/2005 |
| KR | 20080105979 A | 12/2008 |
| KR | 20090037277 A | 4/2009 |
| KR | 20090091692 A | 8/2009 |

\* cited by examiner

*Primary Examiner* — Vu Le

(57) ABSTRACT

Methods and means related to memory resistors are provided. A memristor includes two multi-layer electrodes and an active material layer. One multi-layer electrode forms an Ohmic contact region with the active material layer. The other multi-layer electrode forms a Schottky barrier layer with the active material layer. The active material layer is subject to oxygen vacancy profile reconfiguration under the influence of an applied electric field. An electrical resistance of the memristor is thus adjustable by way of applied programming voltages and is non-volatile between programming events.

16 Claims, 2 Drawing Sheets

MEMORY RESISTOR HAVING MULTI-LAYER ELECTRODES

BACKGROUND

Memory resistors or "memristors" are electronic constructs that exhibit an adjustable, non-volatile electrical resistance. This behavior makes memristors suitable for storage of digital and analog values, instrumentation, switching, and numerous other applications. It is further noted that some memristors are more sought after than others due their respective operating characteristics.

However, the more desirable known memristors are also relatively expensive to the manufacture. This is due, at least in part, to the quantity of rare/noble metals and other expensive materials that are used. Thus, new memristor designs that are less expensive to produce while offering desirable operating characteristics are wanted. The present teachings address the foregoing concerns.

BRIEF DESCRIPTION OF THE DRAWINGS

The present embodiments will now be described, by way of example, with reference to the accompanying drawings, in which.

DETAILED DESCRIPTION

Introduction

Means and methods related to memory resistors (memristors) are provided by the present teachings. A memristor includes two multi-layer electrodes and an active material layer. One multi-layer electrode forms an Ohmic contact region with the active material layer. The other multi-layer electrode forms a Schottky barrier layer with the active material layer. The active material layer is defined by an oxygen vacancy (or mobile dopant) profile. In turn, the mobile dopant profile is subject to reconfiguration under the influence of an applied electric field. An electrical resistance of the memristor is adjustable by way of applied programming voltages and is non-volatile between programming events.

In one embodiment, an apparatus includes a memristor. The memristor includes a high-conductivity layer, and a diffusion barrier layer. The memristor also includes a first layer and a second layer that define an Ohmic contact layer. The Ohmic contact layer is separated from the high-conductivity layer by the diffusion barrier layer. The memristor further includes an active material layer that forms an Ohmic contact region with the Ohmic contact layer. The active material layer includes a profile of mobile dopants that is reconfigurable under the influence of programming voltages applied to the memristor.

In another embodiment, a method includes operating a memristor that is characterized by at least one multi-layer electrode and an active material layer. The method also includes applying a programming voltage across the memristor so as to change a non-volatile electrical resistance of the memristor from a first value to a second value distinct from the first value. The method further includes operating the memristor at the second non-volatile electrical resistance value.

First Illustrative Embodiment

Figure 1:
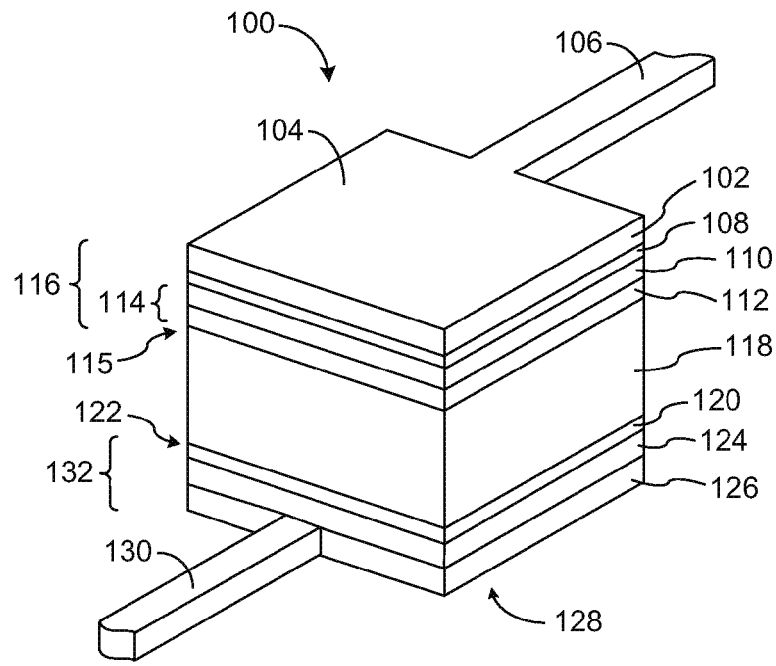
FIG. 1 depicts an isometric view of a memory resistor according to one embodiment.

Reference is now directed to FIG. 1, which depicts an isometric view of a memristor 100. The memristor 100 is illustrative and non-limiting with respect to the present teachings. Thus, other memristors can be configured, constructed or operated in accordance with the present teachings.

The memristor 100 includes a high-conductivity (conductor) layer 102. The conductor layer 102 can be formed from or include any suitable electrically conductive material. Non-limiting examples of conductor layer 102 materials include copper, aluminum, silver, gold, platinum, palladium, titanium nitride (TiN), etc. Other suitable materials can also be used. The conductor layer 102 is configured to define a memristor end area 104 and an electrically conductive pathway (pathway) 106.

The pathway 106 is configured to electrically couple the memristor 100 with another entity or entities such as electronic circuitry, a controller, a data or signal buss, etc. The pathway 106 extends away from the memristor 100 in an illustrative direction. However, it is to be understood that the pathway 106 can lead away from the memristor 100 along any suitable direction and may be linear, curved, serpentine, and so on, in shape.

The memristor 100 also includes a diffusion barrier layer 108. The diffusion barrier layer 108 is in contact with the end area 104 of the conductor layer 102. The diffusion barrier layer 108 is configured to prevent migration of elements (i.e., contamination) from the conductor layer 102 into other portions of the memristor 100. However, electron flow through the memristor 100 is not prevented by the diffusion barrier layer 108. The diffusion barrier layer 108 can be formed from, or include, tantalum nitride (TaN), tungsten nitride (WN), titanium nitride (TiN), etc. Other suitable materials can also be used.

The memristor 100 also includes a metallic layer 110. The metallic layer 110 can be formed from, or include, titanium (Ti) or chromium (Cr). Other suitable metals can also be used. The memristor 100 also includes another metallic layer 112. The metallic layer 112 can be formed from, or include, platinum (Pt), palladium (pd), tungsten (W) etc.

The metallic layers 110 and 112 interacts during manufacture of the memristor 100 to define an Ohmic contact layer 114, which forms an Ohmic contact region 115 at the interface with an active material layer 118. For example, the metallic layer 110 diffuses through the grain boundaries of the metallic layer 112 and then chemically reduces the active material layer 118 to form some localized regions richened with oxygen vacancies at the interface of Ohmic contact layer 114 and active material layer 118. It is noted that the Ohmic contact region 115 is characterized by an electrical resistance but does not exhibit rectifying (i.e., diode-like) behavior.

It is further noted that the active material layer 118 is generally permeable to mobile dopants such as oxygen atoms or oxygen vacancies. However, oxygen ions or vacancies (i.e., mobile dopants) exist within the active material layer 118 such that a distribution or "profile" is defined. These mobile dopants can be controllably migrated within the active material layer 118 under the influence of an electric field (i.e., programming voltage, etc.). In this way, the oxygen-vacancy profile in layer 118 and thus the electrical resistance of the memristor 100 can be reconfigured during normal operation of the memristor 100.

The conductor layer 102, the diffusion barrier layer 108, the metallic layer 110 and the metallic layer 112 collectively define a multi-layer electrode 116 of the memristor 100. It is noted that the diffusion barrier layer 108 separates the Ohmic contact layer 114 from the conductor layer 102. Unwanted elements (e.g., copper or aluminum atoms, etc.) are prevented from contaminating the Ohmic contact region 114 or other aspects of the memristor 100 by way of the diffusion barrier layer 108.

The memristor 100 also includes an active material layer 118 as introduced above. The active material layer 118 can be formed of, or include, a material including oxygen. Non-limiting examples of the active material layer 118 include titanium dioxide ($TiO_2$) and tantalum oxide ($TaO_x$). Other suitable transition metal oxides can also be used. Oxygen anions or oxygen vacancies within the active material layer 118 can be electrostatically migrated toward and away from the metallic layer 110, thus forming or altering the number of oxygen vacancies within the active material layer 118 (e.g., resulting in $TiO_{2-x}$). The electrical resistance characteristics of the active material layer 118 are thereby adjusted, which in turn changes the overall electrical resistance of the memristor 100.

The memristor 100 further includes a Schottky contact layer 120. The Schottky contact layer 120 can be formed from or include platinum (Pt), or another noble metal or non-reactive material. A Schottky barrier 122 exists in-between the Schottky contact layer 120 and the active material layer 118. As a result, the Schottky barrier 122 exhibits rectifying (i.e., diode-like) behavior.

The memristor 100 includes a diffusion barrier layer 124. The diffusion barrier layer 124 is in contact with the Schottky contact layer 120. The diffusion barrier layer 124 is configured to prevent migration of undesired elements. However, electron flow through the memristor 100 is not prevented by the diffusion barrier layer 124. The diffusion barrier layer 124 can be formed from, or include, tantalum nitride (TaN), magnesium nitride (WN), titanium nitride (TiN), etc. Other suitable materials can also be used.

The memristor 100 includes a high-conductivity (conductor) layer 126 that is in contact with the diffusion barrier layer 124. The conductor layer 126 can be formed from, or include, any suitable electrically conductive material. Non-limiting examples of conductor layer 126 materials include copper, aluminum, silver, gold, platinum, palladium, titanium nitride (TiN), etc. Other suitable materials can also be used. The conductor layer 126 is configured to define a memristor end area 128 and an electrically conductive pathway (pathway) 130.

The pathway 130 is configured to electrically couple the memristor 100 with another entity or entities such as electronic circuitry, a controller, a data or signal buss, etc. The pathway 130 extends away from the memristor 100 in an illustrative direction. However, it is to be understood that the pathway 130 can lead away from the memristor 100 along any suitable direction and may be linear, curved, serpentine, etc., in shape.

The conductor layer 126, the diffusion barrier layer 124, and the Schottky contact layer 120 collectively define a multi-layer electrode 132 of the memristor 100. It is noted that the diffusion barrier layer 124 separates the Schottky contact layer 120 and the active material layer 118 from the conductor layer 126. Unwanted elements (e.g., copper or aluminum atoms, etc.) from the conductor layer 126 are prevented from contaminating the Schottky contact layer 120 or active material layer 118 by way of the diffusion barrier layer 124.

It is noted that the non-volatile resistance value of the memristor 100 is increased when programming potential is applied with positive polarity to multi-layer electrode 116 and negative polarity to multi-layer electrode 132. Conversely, the non-volatile resistance value of the memristor 100 is decreased when programming potential is applied with negative polarity to multi-layer electrode 116 and positive polarity to multi-layer electrode 132. It is also noted that the memristor 100 is depicted as having a particular orientation (i.e., top and bottom) of the multi-layer electrode 116 relative to multi-layer electrode 132. However, it is to be understood that other memristors with respectively varying orientations can also be defined, configured and operated in accordance with the present teachings.

The memristor 100 is defined by a uniform, generally square cross-sectional shape. However, other suitable cross-sectional shapes (e.g., round, elliptical, rectangular, triangular, etc.) can also be used. Furthermore, other memristors (not shown) can be formed and operated according to the present teachings that have respectively varying longitudinal cross-sectional areas (e.g., hourglass, ellipsoid, etc.).

Table 1 below includes illustrative and non-limiting characteristics for an embodiment of memristor 100. Other memristors having respectively varying dimensions, characteristics or constituencies are also contemplated by the present teachings. It is noted that within Table 1, "µm" equals $1 \times 10^{-6}$ meters and "nm" equals $1 \times 10^{9}$ meters.

TABLE 1

Illustrative Memristor 100

| Feature | Length × Width × Thickness | Notes/Other |
|---|---|---|
| Conductor 102 | 1 µm × 1 µm × 0.5 µm | Copper thick film |
| Diff. Barrier 108 | 1 µm × 1 µm × 10.0 nm | Tantalum Nitride |
| Metallic Layer 110 | 1 µm × 1 µm × 5.0 nm | Titanium |
| Metallic Layer 112 | 1 µm × 1 µm × 10.0 nm | Platinum |
| Active Layer 118 | 1 µm × 1 µm × 50.0 nm | Titanium Dioxide |
| Schottky 120 | 1 µm × 1 µm × 10.0 nm | Platinum |
| Diff. Barrier 124 | 1 µm × 1 µm × 10.0 nm | Tantalum Nitride |
| Conductor 126 | 1 µm × 1 µm × 0.5 µm | Copper thick film |

First Illustrative Method

Figure 2:
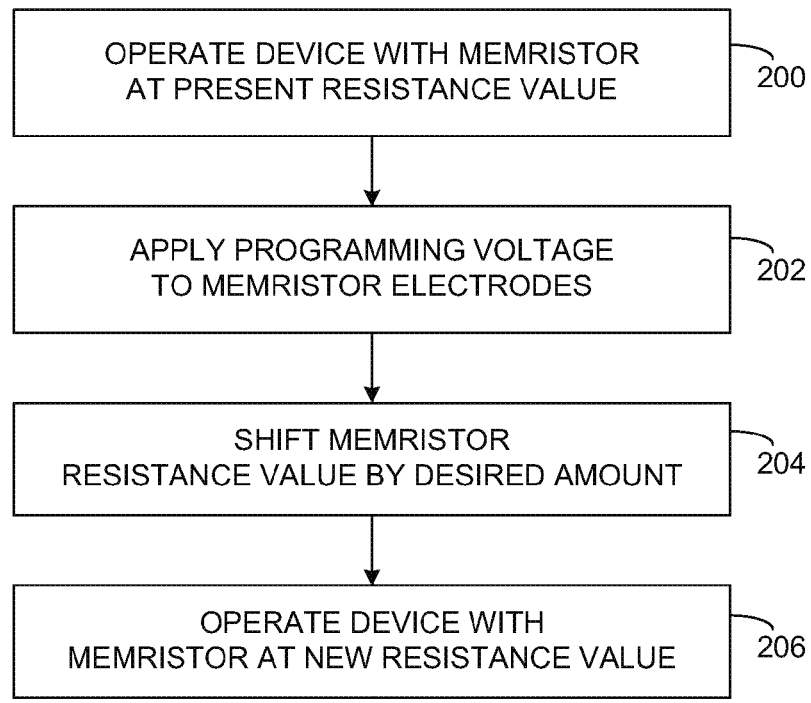
FIG. 2 depicts a flow diagram of a method according to another embodiment.
Figure 3:
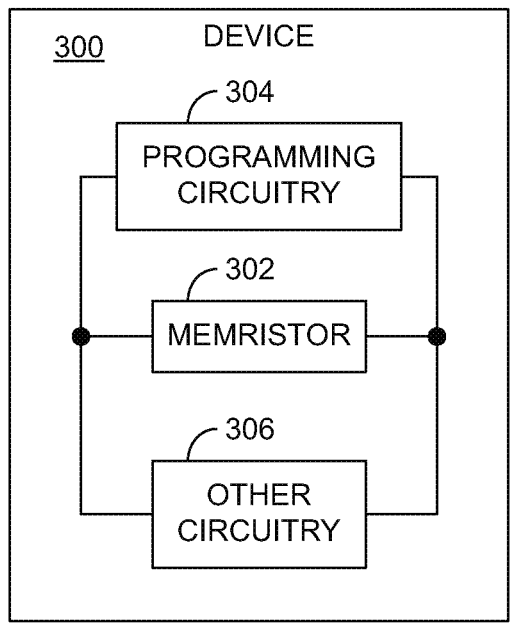
FIG. 3 depicts a block diagram of a device according to one embodiment.

Attention is now directed to FIG. 2, which depicts a method according to one embodiment of the present teachings. The method of FIG. 2 depicts particular method steps and an order of execution. However, it is to be understood that other methods including other steps, omitting one or more of the depicted steps, or proceeding in other orders of execution are also contemplated. Thus, the method of FIG. 2 is illustrative and non-limiting with respect to the present teachings. Reference is made to FIGS. 1 and 3 in the interest of understanding the method of FIG. 2.

At 200, a device, which includes a memristor, is operated at a present electrical resistance value for the memristor. For purposes of non-limiting illustration, it is assumed that a device 300 includes a memristor 302. The memristor 302 is equivalent to any memristor (e.g., 100, etc.) consistent with the present teachings and is characterized by a present non-volatile electrical resistance of 100 Kilo-Ohms at zero bias. Other circuitry 306 of the device 300 is electrically coupled to (or includes) the memristor 302 and operates normally according to the present, non-volatile electrical resistance value.

At 202, a programming voltage is applied to the electrodes of the memristor. For purposes of the ongoing illustration, it is assumed that programming circuitry 304 of the device 300 is used to apply a programming potential across the memristor 302. Such a programming voltage (i.e., pulse or signal) can be defined, for example, by one-point-five volts direct-current applied for one microsecond.

At 204, the electrical resistance value of the memristor is adjusted by a desired amount in response to the applied programming voltage. For purposes of the ongoing illustration, it is assumed that the electrical resistance of the memristor 302 is increased by twenty Ohms, resulting in an overall electrical resistance of two mega-Ohms for the memristor 302. Application of the programming voltage is now stopped.

At 206, the device is operated normally with the memristor at the new electrical resistance value. For purposes of the ongoing illustration, it is assumed that the other circuitry 306 operates normal in accordance with the new, non-volatile electrical resistance value established at 204 above.

In general and without limitation, the present teachings contemplate various memristors (i.e., memory resistors) that can be applied to any number of circuits and device types. Each memristor includes two respective multi-layer electrodes disposed on opposite sides of a layer of active material.

One of the multi-layer electrodes includes an Ohmic contact region. At least one material within the Ohmic contact region is configured to cause (i.e., catalyze) an oxygen-reduction reaction within the active material layer under the influence of heating (i.e., annealing in the fabrication process). The other multi-layer electrode includes at least one noble metal or non-reactive material configured to form Schottky barrier with respect to the active material layer. Diffusion barrier layers within the respective multi-layer electrodes prevent migration of conductor layer elements (e.g., copper, aluminum, etc.), thus preventing contamination of the active material layer or other aspects of the memristor.

Programming (or control) circuitry is used to apply various programming voltages of respective magnitudes, polarities or durations to the memristor. The application of a programming voltage causes oxygen anions or oxygen vacancies (i.e., mobile dopant) migration within the memristor, resulting in a corresponding increase or decrease of oxygen vacancies (e.g., $TiO_{2-x}$, etc.) within the active material layer. In general, direction of mobile dopant migration is determined by the polarity of the applied programming voltage.

In turn, the oxygen vacancy density (or distribution) affects the electrical resistance of the memristor as a whole. In general, the magnitude of the overall electrical resistance shift (increase or decrease) is determined by the magnitude and duration of the applied programming voltage. The electrical resistance value of the memristor is substantially non-volatile (i.e., constant) between programming events. This non-volatility is exhibited despite a total removal of electrical energy (i.e., bias signals, etc.) from the memristor.

First Illustrative Device

Reference is now made to FIG. 3, which depicts a block diagram of a device 300 according to another embodiment of the present teachings. The device 300 is illustrative and non-limiting in nature. Thus, other devices, circuits and systems are contemplated that include one or more aspects of the present teachings.

The device 300 includes a memristor 302 as introduced above. The memristor 302 can be defined by any embodiment consistent with the present teachings. In one embodiment, the memristor 302 is materially and operationally equivalent to the memristor 100 as described above. Other embodiments can also be used.

The device 300 also includes programming circuitry 304. The programming (or control) circuitry 304 is electrically coupled to the memristor 302 and is configured to apply various direct-current (DC) programming voltages thereto. Such programming voltages can vary respectively in magnitude, duration, or polarity of application. The programming circuitry 304 is thus configured to cause controlled changes in the electrical resistance of the memristor 302. The programming circuitry 304 can be defined by or include any suitable components or configuration such as, but not limited to, a microprocessor, a microcontroller, digital circuitry, analog circuitry, a state machine, etc.

The device 300 further includes other circuitry 306 that is electrically coupled to (or includes) the memristor 302. The other circuitry 306 can be defined by any suitable circuitry configured to perform one or more normal operations that use the memristor 302. Non-limiting examples of such operations include cellular communication, environmental sensing, instrumentation and control, radio communication, signal or data storage and retrieval, etc. Thus, the device 300 can be generally defined by any one or more suitable areas of application (e.g., a cellular telephone, a data or signal router, etc.).

Second Illustrative Device

Figure 4:
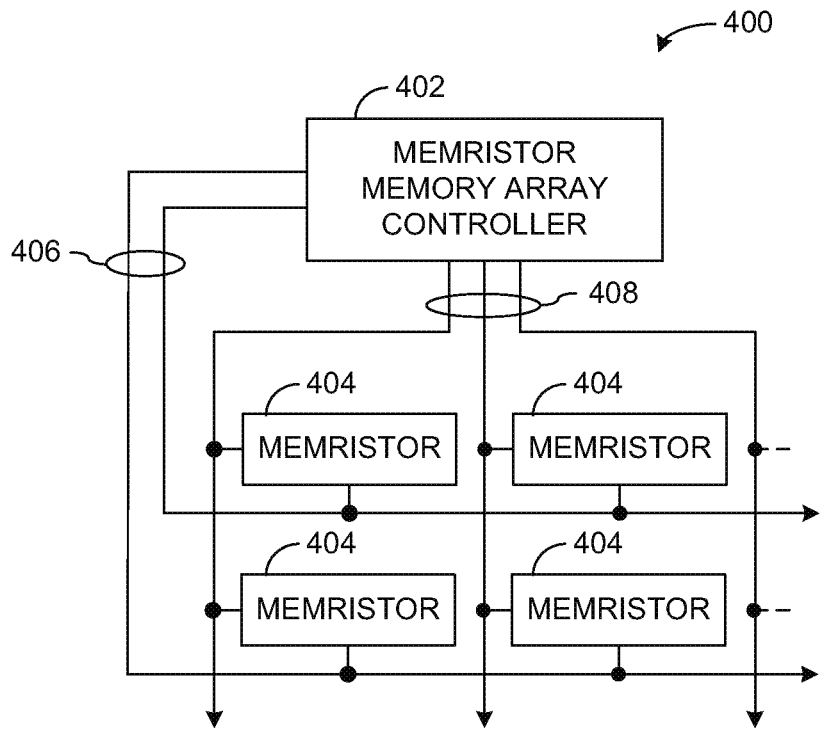
FIG. 4 depicts a block diagram of a device according to another embodiment.

Reference is now made to FIG. 4, which depicts a block diagram of a device 400 according to another embodiment of the present teachings. The device 400 is illustrative and non-limiting in nature. Thus, other devices, circuits and systems are contemplated that include one or more aspects of the present teachings.

The device 400 includes a memristor memory array controller (controller) 402. The controller 402 is configured to address individual memristors 404 of the device 400. Such addressing is performed by way of row control lines 406 and column control lines 408. The controller 402 is also configured to apply programming voltages to the memristors 404 by way of the controls lines 406 and 408.

The device 400 further includes a plurality of memristors 404. Each memristor 404 is defined, configured and operative in accordance with the present teachings. In one embodiment, one or more of the memristors 404 is/are materially and operationally equivalent to the memristor 100 described above. Other embodiments can also be used.

The memristors 404 are arranged as an X-by-Y array, with each memristor 404 being individually addressable and programmable by the controller 402. Each memristor 404 can be operated as a storage cell representing a digital bit, an analog signal level, etc. FIG. 4 depicts a total of four memristors 404 arranged as an array. However, it is to be understood that other arrays including any suitable number of memristors (e.g., 100, 404, etc.) can also be defined and operated in accordance with the present teachings.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus including a memristor, the memristor comprising:
   a high-conductivity layer;
   a diffusion barrier layer;
   a first layer and a second layer defining an Ohmic contact layer, the Ohmic contact layer separated from the high-conductivity layer by the diffusion barrier layer; and an active material layer forming an Ohmic contact region with the Ohmic contact layer, the active material layer including a profile of mobile dopants that is reconfigurable in accordance with programming voltages applied to the memristor.

2. The apparatus according to claim 1, the memristor characterized by a non-volatile electrical resistance that is adjustable by way of the programming voltages.

3. The apparatus according to claim 1, the high-conductivity layer including at least copper, aluminum, platinum, palladium, silver, gold, or titanium nitride.

4. The apparatus according to claim 1, the diffusion barrier layer including at least tungsten nitride, tantalum nitride, or titanium nitride.

5. The apparatus according to claim 1, the first layer including at least titanium, or chromium.

6. The apparatus according to claim 1, the second layer including at least platinum, or palladium.

7. The apparatus according to claim 1, the high-conductivity layer configured to electrically couple the memristor to another entity.

8. The apparatus according to claim 1, the active material layer including at least titanium dioxide, tantalum oxide, or strontium titanate.

9. The apparatus according to claim 1, the active material layer configured such that the mobile dopants are defined by oxygen vacancies.

10. The apparatus according to claim 1, the high-conductivity layer and the diffusion barrier layer and the first layer and the second layer defining a first multi-layer electrode, the memristor further comprising:
a non-reactive metallic layer;
another diffusion barrier layer; and
another high-conductivity layer, the non-reactive metallic layer separated from the other high-conductivity layer by the other diffusion barrier layer, the non-reactive metallic layer and the other diffusion barrier layer and the other high-conductivity layer defining a second multi-layer electrode.

11. The apparatus according to claim 10, the non-reactive metallic layer in contact with the active material layer so as to define a Schottky barrier.

12. The apparatus according to claim 10, the non-reactive metallic layer including at least platinum, or another non-reactive metal.

13. The apparatus according to claim 10, the other diffusion barrier layer including at least tungsten nitride, tantalum nitride, or titanium nitride.

14. The apparatus according to claim 10, the other high-conductivity layer including at least copper, aluminum, platinum, palladium, silver, gold, or titanium nitride.

15. A method, comprising:
operating a memristor characterized by at least one multi-layer electrode and an active material layer;
applying a programming voltage across the memristor so as to change a non-volatile electrical resistance of the memristor from a first value to a second value distinct from the first value; and
operating the memristor at the second non-volatile electrical resistance value.

16. The method according to claim 15, the memristor is further characterized by a first mufti-layer electrode and a second multi-layer electrode, the first multi-layer electrode forming an Ohmic contact region with the active material layer and the second multi-layer electrode forming a Schottky barrier with the active material layer.

* * * * *

UNITED STATES PATENT AND TRADEMARK OFFICE
CERTIFICATE OF CORRECTION

PATENT NO. : 8,737,113 B2
APPLICATION NO. : 13/387063
DATED : May 27, 2014
INVENTOR(S) : Jianhua Yang et al.

It is certified that error appears in the above-identified patent and that said Letters Patent is hereby corrected as shown below:

In the Claims:

In column 8, line 28, in Claim 16, delete "mufti-layer" and insert -- multi-layer --, therefor.

Signed and Sealed this
Twenty-first Day of October, 2014

Michelle K. Lee
*Deputy Director of the United States Patent and Trademark Office*